United States Patent
Queen et al.

(10) Patent No.: US 9,859,374 B2
(45) Date of Patent: Jan. 2, 2018

(54) PRINTING BLANKET INCLUDING MELTABLE POLYMERIC FABRIC REINFORCING LAYER OR POLYMERIC REINFORCING LAYER

(71) Applicant: Day International, Inc., Plymouth, MI (US)

(72) Inventors: Mark Queen, Fletcher, NC (US); Richard Czerner, Weaverville, NC (US); Creg Bradley, Asheville, NC (US); David Blender, Rutherfordton, NC (US)

(73) Assignee: DAY INTERNATIONAL, INC., Plymouth, MI (US)

( * ) Notice: Subject to any disclaimer, the term of this patent is extended or adjusted under 35 U.S.C. 154(b) by 827 days.

(21) Appl. No.: 13/832,854

(22) Filed: Mar. 15, 2013

(65) Prior Publication Data

US 2014/0109783 A1     Apr. 24, 2014

Related U.S. Application Data

(60) Provisional application No. 61/717,992, filed on Oct. 24, 2012.

(51) Int. Cl.
*H01L 29/10* (2006.01)
*B41F 3/46* (2006.01)
(Continued)

(52) U.S. Cl.
CPC ............ *H01L 29/1033* (2013.01); *B41F 3/46* (2013.01); *B41F 17/08* (2013.01); *B41N 10/04* (2013.01); *H01L 21/0332* (2013.01); *H01L 29/0673* (2013.01); *H01L 29/6656* (2013.01); *H01L 29/66545* (2013.01); *H01L 29/66795* (2013.01);
(Continued)

(58) Field of Classification Search
USPC ........................................ 101/401.1
See application file for complete search history.

(56) References Cited

U.S. PATENT DOCUMENTS 3,235,772 A  *  2/1966  Gurin ........................... 361/214
3,881,045 A       4/1975  Strunk
(Continued)

FOREIGN PATENT DOCUMENTS

| EP | 0613791 A2 | 9/1994 |
| WO | 94/02259 A1 | 2/1994 |
| WO | 2009070549 A1 | 6/2009 |

OTHER PUBLICATIONS

Partial Search Report from PCT application No. PCT/US2013/031867 dated Jan. 8, 2014.
(Continued)

*Primary Examiner* — Matthew G Marini
(74) *Attorney, Agent, or Firm* — Dinsmore & Shohl, LLP

(57) ABSTRACT

A printing blanket is provided which includes a reinforcing layer formed from a polymeric fabric reinforcing material which softens and flows at a temperature less than that used in the final curing step of forming the blanket or a polymeric reinforcing material having a thickness of between about 0.003 inches and 0.010 inches. The reinforcing layer provides a smooth surface to support an outer print surface layer and provides improved print performance while enabling a reduction in the overall thickness of the reinforcing layer.

19 Claims, 3 Drawing Sheets

(51) Int. Cl.
  *B41F 17/08* (2006.01)
  *B41N 10/04* (2006.01)
  *H01L 21/033* (2006.01)
  *H01L 29/06* (2006.01)
  *H01L 29/66* (2006.01)
  *H01L 29/78* (2006.01)

(52) U.S. Cl.
  CPC ........ *H01L 29/785* (2013.01); *B41N 2210/04* (2013.01); *B41N 2210/14* (2013.01); *Y10T 156/10* (2015.01)

(56) References Cited

U.S. PATENT DOCUMENTS

| | | |
|---|---|---|
| 5,016,973 A | 5/1991 | Hager et al. |
| 5,644,985 A * | 7/1997 | Serain et al. ............ 101/415.1 |
| 5,700,343 A | 12/1997 | Castelli et al. |
| 6,148,865 A | 11/2000 | Head |
| 6,228,448 B1 | 5/2001 | Ndebi et al. |
| 6,389,965 B1 | 5/2002 | Vrotacoe et al. |
| 6,899,029 B2 * | 5/2005 | Invernizzi .............. 101/376 |
| 7,942,993 B2 | 5/2011 | Gessler et al. |
| 2003/0140805 A1 * | 7/2003 | Hertzog .............. 101/401.1 |
| 2006/0269800 A1 | 11/2006 | Ogawa et al. |
| 2007/0101884 A1 | 5/2007 | Czerner |
| 2009/0142587 A1 | 6/2009 | Byers et al. |

OTHER PUBLICATIONS

Partial Search Report from PCT application No. PCT/US2013/031942 dated Jan. 7, 2014.
European Search Report dated Jul. 6, 2017 for Application No. 17154884.5 Filed Feb. 6, 2017. pp. 1-7.

* cited by examiner

PRINTING BLANKET INCLUDING MELTABLE POLYMERIC FABRIC REINFORCING LAYER OR POLYMERIC REINFORCING LAYER

CROSS REFERENCE TO RELATED APPLICATIONS

This application claims the benefit of U.S. Patent Application Ser. No. 61/717,992, entitled PRINTING SLEEVE INCLUDING MELTABLE CORD OR POLYMERIC REINFORCING LAYER. The entire contents of said application is hereby incorporated by reference.

BACKGROUND OF THE INVENTION

Embodiments of the invention relate to a printing blanket for use in lithographic printing including a compressible layer and a reinforcing layer, and more particularly, to a printing blanket including a polymeric fabric reinforcing layer or a polymeric reinforcing layer which provides a smooth surface to support an outer print surface layer to provide improved print performance while enabling a reduction in the overall thickness of the reinforcing layer.

One of the most common commercial printing processes is offset lithography. In this printing process, ink is offset from a printing plate to a rubber-surfaced printing blanket or sleeve before being transferred to a substrate, such as paper. Where a printing blanket is used, it is typically constructed using a fabric or reinforced polymer base, and then the layers comprising the blanket are attached to the base. Such layers can include one or more compressible layers, one or more reinforcing layers, and an outer print surface layer.

The reinforcing layer for current commercial blankets typically comprises a fabric layer, which is comprised of natural or synthetic materials such as polyester, cotton, or blends thereof. The fabric layer stabilizes and reinforces the other functional layers on the blanket. However, a disadvantage of such materials is that the resulting reinforcing layer does not exhibit surface uniformity, which can result in the problem of threads or textures from the underlying reinforcement layer causing non-uniformities in the printing face, and ultimately the printed image. The fabric may also allow liquid printing chemicals such as inks, fountain solution, and blanket wash to wick into the fabric, potentially causing printing problems and reducing blanket life.

In addition, the reinforcing layer is typically about 0.008 to 0.010 inches (0.2 mm to 0.254 mm) in thickness. In order to improve print quality, it would be desirable to provide a printing blanket in which the reinforcing layer has a reduced thickness, which does not cause non-uniformities in the printing face, and which restricts the penetration of printing chemicals. Such a thinner reinforcing layer would allow the use of a thicker compressible layer without increasing the overall thickness of the blanket. This, in turn, would avoid undesirable compression set and improve print quality. Accordingly, there is a need in the art for a printing blanket which provides improved print performance.

SUMMARY

Embodiments of the invention meet those needs by providing a printing blanket including a reinforcing layer which provides a uniformly smooth surface while stabilizing the printing surface layer to provide improved print quality and increase the life of the blanket. By "printing blanket," it is meant an offset printing blanket which may include tensioned blankets, non-tensioned blankets, metal-backed blankets, coating blankets, and adhesive-backed blankets.

The reinforcing layer may comprise a polymeric fabric reinforcing layer which is "meltable," i.e., it melts and flows at the temperatures used in the final curing step of forming the blanket. By "fabric," we mean monofilament as well as multiple filament threads, and woven as well as non-woven materials. The melting causes the polymer to flow toward and bond to adjacent filaments, resulting in a thinner structure than that of the fabric layer prior to melting as well as producing a smoother, more uniform surface. Alternatively, the reinforcing layer may comprise a polymeric material.

The use of a meltable fabric reinforcing layer replaces traditional fabric layers which are comprised of higher melting temperature materials which do not soften or melt during fabrication of the blanket. The meltable fabric and polymeric reinforcing materials also provide a thinner and more uniformly smooth reinforcing layer which is less disruptive to the print surface layer, resulting in higher quality printing. The use of a reinforcing layer described herein also allows the use of a thicker compressible layer, which aids in stabilizing the printing surface during printing operations, reduces heat buildup during printing, and reduces the likelihood of undesirable streaking of the printed image.

According to one aspect of the invention, a printing blanket is provided which comprises a compressible layer and a first polymeric fabric reinforcing layer positioned above the compressible layer, wherein at least a portion of adjacent threads of the fabric reinforcing layer have flowed together and bonded to form a reinforcing layer having reduced thickness. The blanket further includes a printing surface layer on the fabric reinforcing layer. The blanket may further comprise a base layer supporting the compressible layer. The base layer may be comprised of metal, fabric, or polymers, including fiber-reinforced polymers.

In one embodiment, the first polymeric fabric reinforcing layer comprises a material which softens and flows at a temperature of between about 100° C. and 200° C. In one embodiment, the first polymeric fabric reinforcing layer comprises a woven fabric. In another embodiment, the first polymeric fabric reinforcing layer comprises a material selected from fluorinated ethylene propylene, linear low density polyethylene, polyethylene, polypropylene, nylon copolymers, polyester copolymers, high density polyethylene, and ethylene/propylene copolymers. Prior to heating or curing, the first polymeric fabric reinforcing layer preferably has a thickness between about 0.008 to about 0.010 inches (0.20 to 0.25 mm). After heating or curing, the reinforcing layer has a thickness between about 0.003 to 0.008 inches (0.076 to 0.2032 mm), and more preferably, about 0.003 to 0.005 inches (0.076 mm to 0.127 mm).

The compressible layer preferably comprises nitrile rubber or other rubber or elastomer materials including ethylene/propylene rubber, EPDM, butyl rubber, fluoroelastomers, polyurethane, and blends thereof. The compressible layer is volume compressible and contains voids therein comprising microspheres or voids produced by techniques known in the art such as gas injection or by the introduction of chemical blowing agents.

The thickness of the compressible layer may be increased as a result of the reduced thickness of the reinforcing layer. For example, the compressible layer may be increased in thickness by about 0.002 to 0.005 inches (0.508 mm to 0.127 mm). As some blankets have a compressible layer thickness as low as 0.012 to 0.015 inches (0.3048 to 0.381 mm), such an increase in thickness (gauge) is significant. It should be appreciated that the thickness of the compressible layer may vary according to the total blanket thickness.

The print surface layer preferably comprises nitrile rubber but may also comprise other rubber or elastomer materials including ethylene/propylene rubber, EPDM, butyl rubber, fluoroelastomers, polyurethane, and blends thereof.

In one embodiment, the printing blanket may comprise a second fabric reinforcing layer positioned below the first fabric reinforcing layer. The second fabric reinforcing layer may comprise a conventional woven material which does not melt at the curing temperatures described above, i.e., a material having a melting point greater than about 200° C. The second fabric reinforcing layer is preferably comprised of natural or synthetic materials such as polyester, cotton, or blends thereof.

In another alternative embodiment, the first fabric reinforcing layer may comprise a hybrid layer comprising a first polymeric fabric material which flows at temperatures used to cure the blanket and a second, non-meltable fabric reinforcing material, i.e., a material having a melting point greater than about 200° C. Thus, in this embodiment, the reinforcing layer comprises both meltable and non-melting fibers or filaments in the fabric, such that when the meltable filaments are heated/cured, they flow around the non-melting filaments to provide a surface that is more uniform (i.e., smoother) than the use of conventional fabric alone. For example, a hybrid fabric may comprise warp filaments of the first meltable polymeric material and weft filaments of the second non-melting material.

In an alternative embodiment of the invention, a printing blanket is provided which comprises a compressible layer, a polymeric reinforcing layer over the compressible layer, and a printing surface layer, where the polymeric reinforcing layer comprises a film having a thickness of between about 0.003 to 0.008 inches (0.076 to 0.20 mm). The polymeric reinforcing layer is comprised of a polymeric material selected from rubber, and thermoplastic polymers or thermosetting polymers including polyester, polycarbonate, and rigid polyurethane.

In one embodiment, the polymeric reinforcing layer includes reinforcing materials selected from chopped fiberglass, woven and nonwoven fabrics, pulp, chopped fibers, continuous filaments, cords, and fillers to aid in providing the required tensile modulus for stabilization of the print layer. The fillers may comprise carbon black, clay or silica.

In one method of making the printing blanket, a compressible layer is provided, and a first polymeric fabric reinforcing layer is positioned on the compressible layer. A printing surface layer is then applied on the fabric reinforcing layer. The layers in the blanket are then cured at a temperature above the melting point or softening point of the polymeric fabric reinforcing layer such that the reinforcing layer softens and flows. The blanket is preferably cured at a temperature between about 225° F. and 350° F. (107° C. to 177° C.).

In an alternative method of making the printing blanket, a polymeric reinforcing layer is applied over a compressible layer, where the polymeric reinforcing layer comprises a film having a thickness between about 0.003 inches and 0.010 inches (0.076 to 0.25 mm). A printing surface layer is applied over the polymeric reinforcing layer. In one embodiment, the polymeric reinforcing layer is applied in the form of a film. In another embodiment, the polymeric reinforcing layer is applied in the form of a coating.

Accordingly, it is a feature of embodiments of the invention to provide a printing blanket including a meltable fabric reinforcing layer or a polymeric reinforcing layer which improves the printing performance of the blanket. These, and other features and advantages of the invention will become apparent from the following detailed description, the accompanying drawings, and the appended claims.

DETAILED DESCRIPTION OF THE PREFERRED EMBODIMENTS

Figure 1:
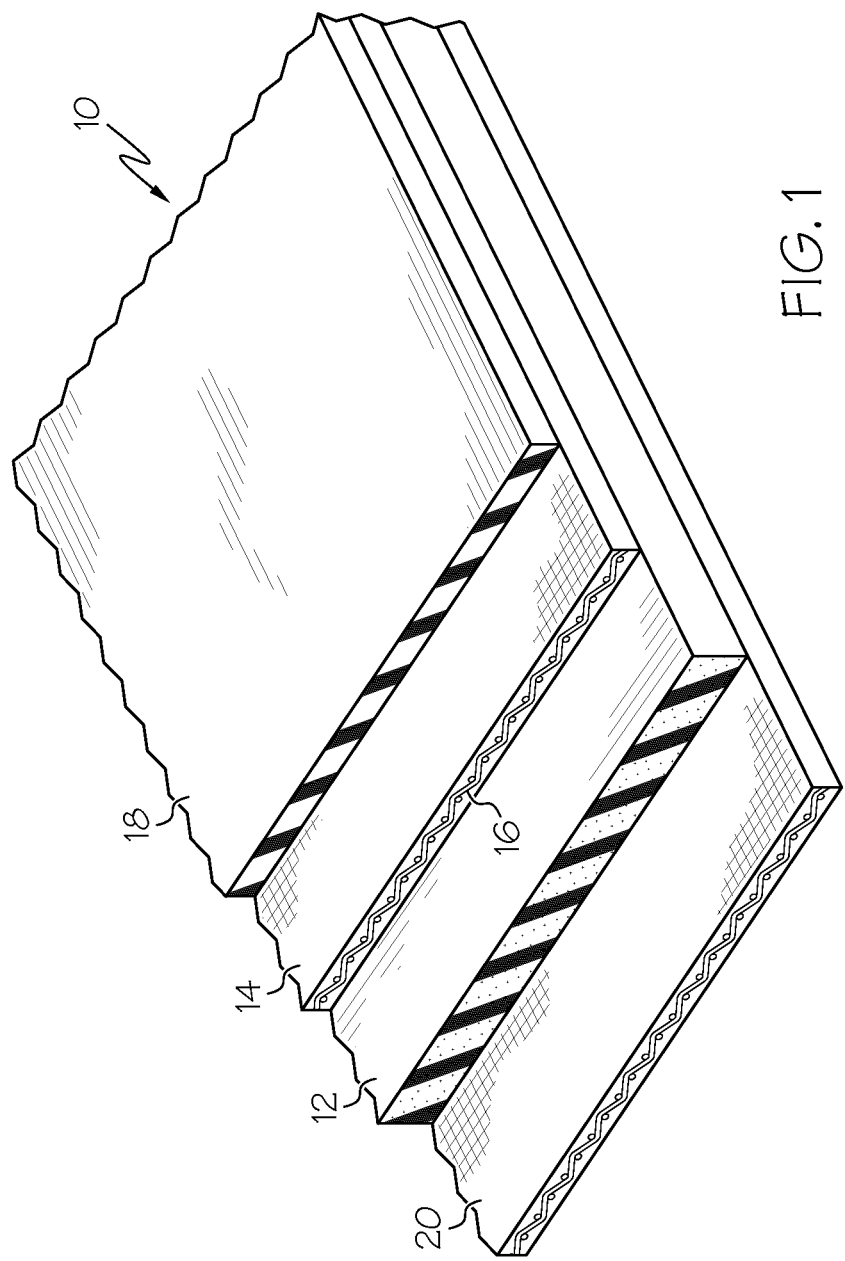
FIG. 1 is a perspective view of a printing blanket in accordance with an embodiment of the invention.

Embodiments of the printing blanket which include a meltable polymeric fabric reinforcing layer or a polymeric reinforcing layer provide improved print quality. Where the polymeric reinforcing fabric layer comprises a meltable material, upon melting/softening at the temperatures used to cure the other materials making up the blanket, the flow of the fabric material reduces the thickness of the reinforcing layer and provides a smooth, uniform surface.

Where the reinforcing layer comprises a polymeric material, the layer may be applied in a coating of the desired thickness which is also smooth and uniform, or the layer may be applied as a pre-formed film.

The use of a meltable fabric layer or a polymeric reinforcing layer as described herein also allows one to increase the thickness of the compressible layer without increasing the overall thickness of the blanket. During printing, this increased compressible layer thickness helps to keep the printing blanket cooler, and prevents the blanket from experiencing compression set, i.e., permanent deformation. The reinforcing layer also increases the useful life of the printing blanket by permitting the blanket to run cooler and by reducing local differential shear stresses that are associated with the discontinuous nature of fabric reinforcing layers that are typically used in current blankets. The meltable fabric layer or polymeric reinforcing layer also improves printing performance and increases the life of the blanket by preventing printing chemicals from wicking in to the reinforcing layer, which often occurs with conventional fabric reinforcing layers.

In addition, the printing blanket avoids the occurrence of the slurring of ink dots which can occur once the blanket warms to normal press operating temperatures, i.e., the layers in the printing blanket remain stable such that the ink dots formed on the substrate to be printed (e.g., paper) do not slur or streak.

Unless otherwise indicated, the disclosure of any ranges in the specification and claims are to be understood as including the range itself and also anything subsumed therein, as well as endpoints.

The printing blanket preferably includes a base layer comprised of fabric, metal, or polymer. The compressible layer preferably comprises nitrile rubber but may also comprise other rubber or elastomeric materials including ethylene/propylene rubber, EPDM, butyl rubber, fluoroelastomers, polyurethane, and blends thereof. The compressible layer is preferably applied to the base layer in a conventional manner such as, for example, knife coating, extrusion, lamination, calendaring, flow coating, roll coating, and the like.

The first polymeric fabric reinforcing layer is comprised of a material selected from fluorinated ethylene propylene, linear low density polyethylene, polyethylene, polypropylene, nylon copolymers, polyester copolymers, high density polyethylene, and ethylene/propylene copolymers, all of which melt at the temperatures used to cure the materials in the blanket. Preferred materials for use include RF7253 thermo-fusible monofilaments commercially available from Luxilon Industries. The monofilaments may be used alone or combined to form a multifilament thread. The filaments may be either woven or nonwoven.

However, it should be appreciated that any suitable polymeric fabrics may be used as long as they melt/soften at a temperature of between about 100° C. to 200° C. and flow and bond to adjacent filaments to provide a smooth surface. It should also be appreciated that use of thinner fabrics having a high thread count (TPI) will result in a smoother surface. By TPI, it is meant threads per inch.

The fabric reinforcing layer is preferably applied onto the compressible layer in a conventional manner. The fabric may be processed through a dip tank containing a suitable adhesive such as a rubber cement or other commercially available adhesives prior to being applied to the compressible layer. If desired, a primer or adhesive may be applied to the fabric, compressible layer, and/or print layer to enhance adhesion between layers and materials. Suitable primers for use include Lord Chemlock® 205 and Lord Chemlock® 233x, commercially available from Lord Corporation. Such primers may be applied by any known conventional methods including brushing, wiping, spraying, roll coating, and the like.

A second fabric reinforcing layer may also be included in the blanket and is located between the first reinforcing fabric layer and the compressible layer. The additional fabric is preferably comprised of natural or synthetic textile materials such as polyester, cotton, or blends thereof. This second fabric layer remains stable when exposed to the final curing temperatures, i.e., it does not melt at temperatures below 200° C.

Alternatively, the fabric reinforcing layer may be woven to form a hybrid reinforcing layer in which the meltable filaments will soften and flow to adjacent non-melting filaments during final cure of the blanket.

Where the reinforcing layer comprises a polymeric reinforcing layer, the layer is preferably in the form of a film having a thickness between about 0.003 inches and 0.010 inches. The polymeric reinforcing layer is preferably comprised of nitrile rubber, or other rubber or elastomeric materials. The polymeric material may also comprise high strength thermoplastic or thermosetting polymers such as polyester, polycarbonate, and rigid polyurethane, which may be cured with conventional curing agents or which may be cured by UV or electron beam radiation.

The polymeric reinforcing layer may optionally include reinforcing fillers such as carbon black, clay, silica, or any other suitable filler materials. The polymeric reinforcing layer may also optionally include reinforcing fiber materials such as chopped fiberglass, Kevlar® pulp, woven and non-woven fabric, chopped fibers, continuous filaments, cords, and the like. The fiber materials may be comprised of glass, metal, carbon, or synthetic or natural textile materials.

A printing surface layer is applied over the fabric reinforcing layer by knife coating, roll coating, flow coating, extrusion, calendaring, lamination, and the like. Suitable materials for use as the print surface layer include nitrile rubber or other rubber or elastomeric materials including ethylene/propylene rubber, EPDM, butyl rubber, fluoroelastomers, polyurethane, and blends thereof.

After application of the print surface layer, the blanket is cured at a temperature of between about 225° F. and 350° F. (107° C. to 177° C.) by the application of heat, or by heating in a heated chamber. At least a portion of the fabric reinforcing layer then softens/melts and flows to fill the spaces between adjacent filaments. The melted fabric layer adheres to itself and to the adjacent layers, i.e., the compressible layer and adjacent printing surface layer. It should be appreciated that the filaments melt and flow prior to flowing of the print surface layer such that the printing layer does not flow into the areas between the filaments. Alternatively, the filaments may be heated and melted before the print surface layer is applied over the reinforcing layer.

After curing, the blanket is then cooled to ambient temperature, which causes the reinforcing fabric layer to re-solidify.

Figure 2A:
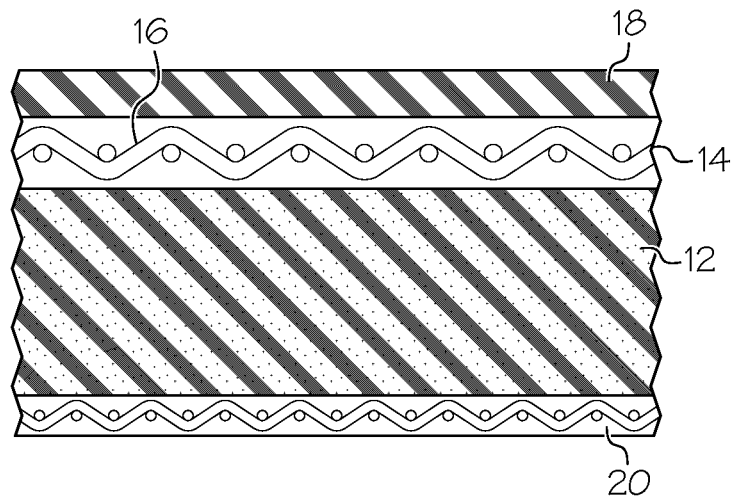
FIG. 2A is a cross-sectional view of the blanket illustrating the embodiment including a meltable fabric reinforcing layer.
Figure 2B:
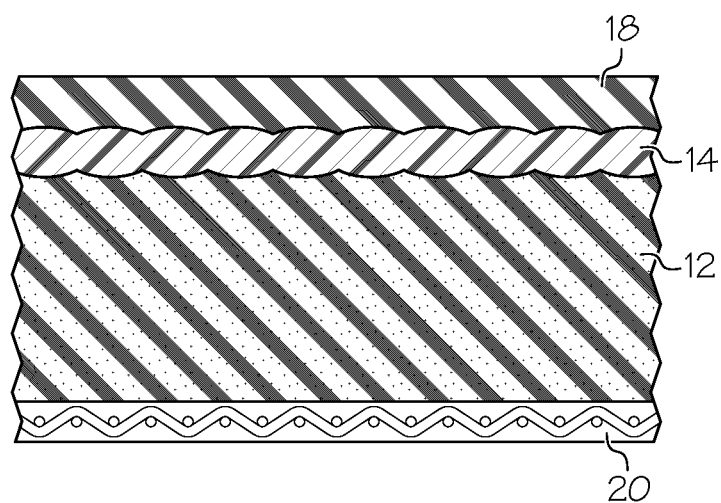
FIG. 2B is a cross-sectional view of the blanket of FIG. 2A which has been subjected to curing temperatures.

Referring now to FIG. 1, an embodiment of the printing blanket 10 is shown. As shown in FIG. 1 and in cross-section in FIG. 2A, the printing blanket includes a base layer 20 comprising either a fabric, metal, polymer, or fiber-reinforced polymer. The blanket further includes a compressible layer 12, a first polymeric fabric reinforcing layer 14 comprised of meltable filaments 16, and a print surface layer 18. The base layer 20 may be adhered to the adjacent layers with an adhesive. In the embodiment shown, the blanket has not been subjected to a curing operation and the fabric layer has a thickness of about 0.008 to 0.010 inches (0.20 to 0.254 mm). In the embodiment shown in FIG. 2B, the printing blanket has been subjected to curing temperatures such that at least a portion of the fabric layer has melted and flowed to adjacent filaments to provide a reduced layer thickness of about 0.003 to 0.008 inches (0.076 to 0.2032 mm).

Figure 2C:
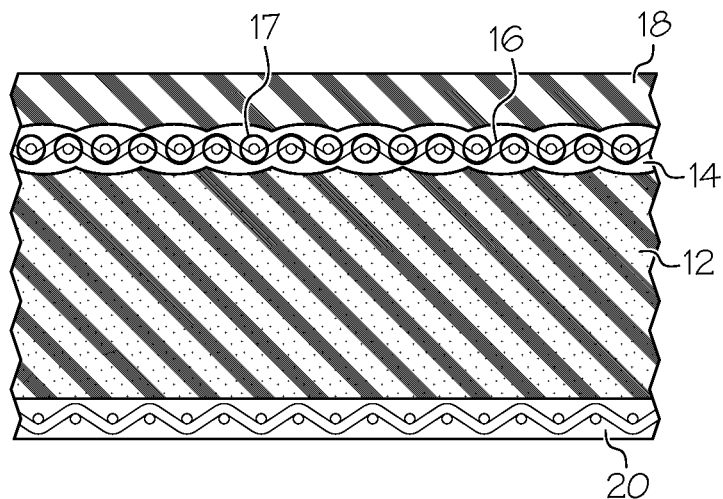
FIG. 2C is a cross-sectional view of a blanket illustrating a hybrid reinforcing layer in accordance with another embodiment of the invention.

In yet another embodiment illustrated in FIG. 2C, a printing blanket is shown which includes a hybrid reinforcing layer 14 comprised of meltable threads/filaments 16 and non-melting threads/filaments 17. In this embodiment, the meltable filaments may be interwoven with conventional (non-melting) filaments. As described above, during the curing step, the meltable filaments melt and flow around the non-melting filaments to form a hybrid reinforcing layer which exhibits a smooth surface.

Figure 3:
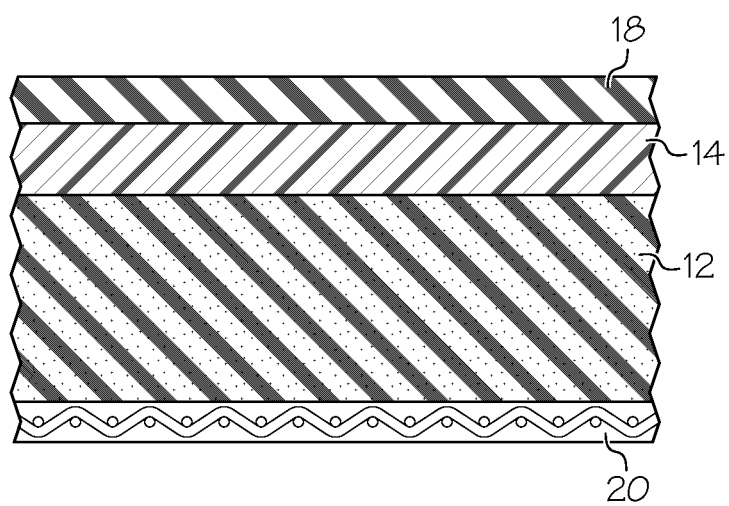
FIG. 3 is a cross-sectional view of a printing blanket utilizing a polymeric reinforcing layer in accordance with another embodiment of the invention.

Referring now to FIG. 3, another embodiment of the invention is illustrated in which the printing blanket includes a polymeric reinforcing layer 14. The polymeric reinforcing layer may be applied by a number of conventional methods including knife coating, cement spreading, roll coating, ribbon coating, spray coating, extrusion, lamination, or any method which results in a smooth surface.

Alternatively, the polymeric layer may be applied to the blanket carcass as an extruded or calendared sheet, preferably as a full width sheet on the compressible layer. Alternatively, the polymeric reinforcing layer may be applied as a coextruded layer on the second surface of the print surface layer.

Where the polymeric reinforcing layer is comprised of a thermoplastic material, after application, the reinforcing layer is cooled to a solid prior to application of the printing surface layer. Where thermosetting polymers are used, the reinforcing layer may be cured or partially cured to a consistency which may optionally be ground to the desired final dimensions to which the print layer may be applied. Alternatively, the thermosetting polymers may be coextruded onto the base (second surface) of the printing surface layer. In this instance, it is not necessary to cure or grind the reinforcing layer prior to applying the printing surface layer.

The use of primers or adhesives as described above may also be applied to the compressible layer and/or print layer to enhance adhesion of the polymeric reinforcing layer.

Because the polymeric reinforcing layer can be made very smooth, it may be thicker than fabric reinforcing layers or other described reinforcing layers without causing print quality defects due to uneven surface texture or hardness of the printing face above the reinforcing layer. As a result, the polymeric reinforcing layer may be constructed at any desired thickness above the compressible layer in order to achieve desired reinforcing strength. When necessary to obtain optimum strength, the polymeric reinforcing layer may comprise a thickness that includes a portion of the normal thickness of the printing surface layer, in which case the printing surface gauge may be reduced to provide a final total thickness that is needed for the overall blanket construction. Therefore, it is possible to optimize the total structure to increase the compressible layer gauge while also increasing the reinforcing layer gauge and reducing the printing surface gauge to achieve a blanket that provides excellent print quality and long life.

The resulting printing blanket provides excellent print quality when used in offset printing applications.

Having described the invention in detail and by reference to preferred embodiments thereof, it will be apparent that modifications and variations are possible without departing from the scope of the invention.

What is claimed is:

1. A printing blanket comprising:
   a base layer;
   a compressible layer;
   a first polymeric fabric reinforcing layer on said compressible layer, said polymeric fabric having a melting point or softening point below the curing temperature for said printing blanket; wherein at least a portion of adjacent filaments of said fabric reinforcing layer have flowed together and bonded to form a reinforcing layer having reduced thickness; and
   a printing surface layer on said fabric reinforcing layer.

2. The printing blanket of claim 1 further comprising a base layer supporting said compressible layer.

3. The printing blanket of claim 1 wherein said first polymeric fabric reinforcing layer softens and flows at a temperature of between about 100 and 200° C.

4. The printing blanket of claim 1 wherein said first polymeric fabric reinforcing layer comprises woven threads.

5. The printing blanket of claim 1 wherein said first polymeric fabric reinforcing layer comprises a material selected from the group consisting of fluorinated ethylene propylene, linear low density polyethylene, polyethylene, polypropylene, nylon copolymers, polyester copolymers, high density polyethylene, and ethylene/propylene copolymers.

6. The printing blanket of claim 1 wherein said first polymeric fabric reinforcing layer has a thickness of about 0.008 to 0.010 inches (0.20 to 0.25 mm) prior to heating or curing and a thickness of about 0.003 to 0.008 inches (0.076 to 0.2032 mm) after heating or curing.

7. The printing blanket of claim 1 further including a second fabric reinforcing layer positioned below said fabric reinforcing layer.

8. The printing blanket of claim 7 wherein said second fabric reinforcing layer comprises a material having a melting point greater than about 200° C.

9. The printing blanket of claim 7 wherein said second fabric reinforcing layer is comprised of a natural or synthetic materials selected from the group consisting of polyester, cotton, or blends thereof.

10. The printing blanket of claim 1 wherein said first polymeric fabric reinforcing layer is a hybrid layer comprising a first polymeric material which flows at temperatures used to cure said blanket and a second non-melting material.

11. A printing blanket comprising:
    a base layer;
    a compressible layer;
    a polymeric reinforcing layer over said compressible layer; said polymeric reinforcing layer comprising a film selected from polycarbonate and rigid polyurethane and having a thickness between about 0.003 inches and 0.010 inches (0.076 to 0.25 mm); and
    a printing surface layer.

12. The printing blanket of claim 11 wherein said polymeric reinforcing layer further comprises reinforcing materials selected from the group consisting of chopped fiberglass, woven and nonwoven fabrics, pulp, chopped fibers, continuous filaments, cords, and fillers.

13. The printing blanket of claim 12 wherein said polymeric reinforcing materials comprise fillers selected from carbon black, clay, or silica.

14. A method of making a printing blanket comprising:
    providing a compressible layer over a base layer;
    applying a first polymeric fabric reinforcing layer on said compressible layer;
    applying a printing surface layer on said fabric reinforcing layer; and
    curing the layers in said blanket at a temperature above the melting point or softening point of said polymeric fabric reinforcing layer such that said reinforcing layer softens and flows to form a reinforcing layer having reduced thickness.

15. The method of claim 14 wherein said first polymeric fabric reinforcing layer softens and flows at a temperature of between about 100 and 200° C.

16. The method of claim 14 wherein said blanket is cured at a temperature between about 225° F. and 350° F. (107° C. to 177° C.).

17. A method of making a printing blanket comprising:
    providing a compressible layer over a base layer;
    providing a polymeric reinforcing layer over said compressible layer; said polymeric reinforcing layer comprising a film selected from polycarbonate and rigid polyurethane and having a thickness between about 0.003 inches and 0.010 inches (0.076 to 0.25 mm); and
    applying a printing surface layer on said polymeric reinforcing layer.

18. The method of claim 17 wherein said polymeric reinforcing layer is applied in the form of a film.

19. The method of claim 17 wherein said polymeric reinforcing layer is applied in the form of a coating.

* * * * *